(12) United States Patent
Itoh

(10) Patent No.: US 7,183,551 B2
(45) Date of Patent: Feb. 27, 2007

(54) INFRARED-RAY ABSORPTION FILM

(75) Inventor: Toshiki Itoh, Ohta-ku (JP)

(73) Assignee: DENSO Corporation, Kariya (JP)

( * ) Notice: Subject to any disclaimer, the term of this patent is extended or adjusted under 35 U.S.C. 154(b) by 0 days.

(21) Appl. No.: 11/008,804

(22) Filed: Dec. 9, 2004

(65) Prior Publication Data

US 2005/0133722 A1     Jun. 23, 2005

(30) Foreign Application Priority Data

Dec. 9, 2003    (JP)    ............................. 2003-410372

(51) Int. Cl.
  *G01J 5/00*    (2006.01)
(52) U.S. Cl. .................................. 250/338.1
(58) Field of Classification Search ............... 250/338.1
  See application file for complete search history.

(56) References Cited

U.S. PATENT DOCUMENTS

| | | | |
|---|---|---|---|
| 4,048,980 A * | 9/1977 | Googin et al. | ............... 126/661 |
| 6,348,650 B1 | 2/2002 | Endo et al. | |
| 6,513,540 B2 | 2/2003 | Erdei et al. | |
| 2002/0182538 A1* | 12/2002 | Tomita et al. | ............ 430/278.1 |
| 2002/0185169 A1 | 12/2002 | Hamamoto et al. | |
| 2004/0191497 A1* | 9/2004 | Hiraoka et al. | ............ 428/304.4 |
| 2004/0200962 A1* | 10/2004 | Ishikawa et al. | ......... 250/339.04 |

FOREIGN PATENT DOCUMENTS

| | | |
|---|---|---|
| JP | 2000-340848 | 12/2000 |
| JP | 2003-65481 | 3/2003 |
| JP | 2003-101083 | 4/2003 |

* cited by examiner

*Primary Examiner*—David Porta
*Assistant Examiner*—Marcus Taningco
(74) *Attorney, Agent, or Firm*—Harness, Dickey & Pierce, PLC

(57) ABSTRACT

The invention aims at providing an infrared-ray absorption film having a low reflection factor and a high absorption ratio equivalent to those of gold black through an economical process such as ink jet printing involving the steps of printing a porous material solution and then conducting sintering without using a vacuum process. The invention provides an infrared-ray absorption film using a porous material which suitably has a pore size within the range of hundreds of nm to several μm and is formed of a metal oxide of carbon or silica, an organic/inorganic hybrid material or a meso-porous material having the composition described above. The infrared-ray absorption film is produced by applying the porous material precursor solution onto a substrate and then conducting sintering.

4 Claims, 1 Drawing Sheet

INFRARED-RAY ABSORPTION FILM

BACKGROUND OF THE INVENTION

1. Field of the Invention

This invention relates to an infrared-ray absorption film that will be suitable for an infrared-ray sensor having improved detection sensitivity.

2. Description of the Related Art

A heat-type infrared-ray sensor for detecting infrared-rays by utilizing the change of an electric resistance value depending on a temperature change has been utilized in the past and its infrared-ray detection portion has an infrared-ray absorption film. Gold black is used in many cases as the infrared-ray absorption film because it exhibits high absorption efficiency to the infrared-rays (refer to Japanese Unexamined Patent Publication (Kokai) No. 2003-65481, for example). However, because a vacuum process such as vacuum deposition has been used ordinarily for forming the film, the gold black film is not free from the problem of high cost.

SUMMARY OF THE INVENTION

It is an object of the invention to provide an infrared-ray absorption film that can be acquired through an economical process, such as ink jet printing, by printing and sintering a porous material solution without using the vacuum process, and has low reflection factor and high absorption ratio equivalent to those of gold black.

The gist of the invention resides in an infrared-ray absorption film using a porous material. The porous material suitably has a pore size within the range of hundreds of nm to several μm and is carbon or a meso-porous material. Such an infrared-ray absorption film is formed by applying a porous material precursor solution onto a substrate and then conducting sintering.

According to the invention, there is provided an infrared-ray absorption film having low reflection factor and high absorption ratio equivalent to those of gold black. In other words, the porous material of the invention has surface concavity and convexity equivalent to the wavelength of the infrared-rays that suppress surface reflection of the infrared-rays and pores equivalent to or smaller than the wavelength of the infrared-rays that increase irregular reflection inside the material and hence, an effective infrared-ray absorption ratio. Because specific heat of the porous material is low, it is expected that the response of an infrared-rays sensor can be improved.

DESCRIPTION OF THE PREFERRED EMBODIMENTS

An infrared-ray absorption film according to the invention uses a porous material. The pore size of this porous material is suitably within the range of several hundreds of nm to several μm. Such a porous material is formed of carbon or a meso-porous (having a pore diameter of 2 to 50 nm) material.

The infrared-ray absorption film using the porous material is suitably formed by the steps of applying a porous material precursor solution onto a substrate by ink jet printing, etc, and then conducting sintering. Examples of such a porous material precursor solution are a solution prepared by dispersing carbon particles and resin particles in a dispersion medium and a solution prepared by dispersing resin particles in a dispersion medium containing a meso-porous skeletal material (such as a metal alkoxide), a surface active agent and water.

The pore size of the porous material in the invention is decided by burn-out of the resin particles described above.

For example, the following procedure is preferably used in the case of the carbon porous material.

Figure 1:
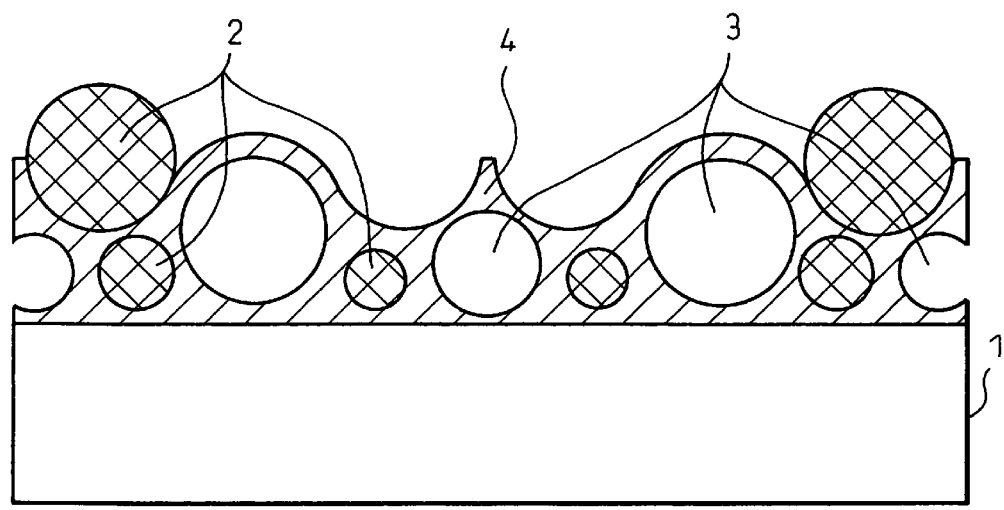
FIG. 1 is a schematic view of a carbon porous material film according to the invention.
Figure 2:
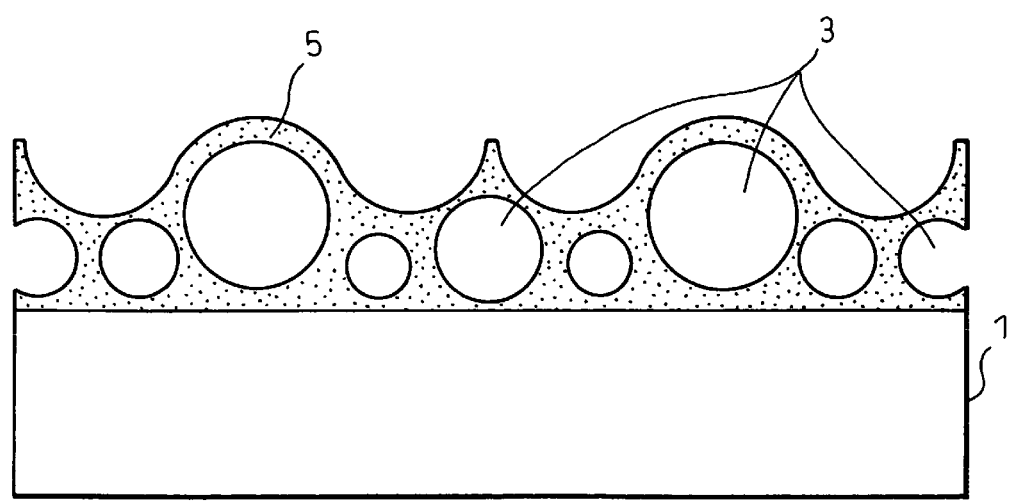
FIG. 2 is a schematic view of a meso-porous material film according to the invention.

First, carbon particles such as pitch coke particles having a diameter within the range of several hundreds of nm to several μm are mixed with about an equal volume of resin particles such as an acrylic resin or polystyrene resin similarly having a diameter within the range of several hundreds of nm to several μm and the mixture is dispersed in a dispersion medium such as xylene or methyl ethyl ketone to prepare the carbon porous material precursor solution. Adjustment of the viscosity is made by adjusting the proportion of the particles and the dispersion medium. Next, this carbon porous material precursor solution is precisely applied (printed) at a desired position, preferably by ink jet printing. Various coating methods can be employed besides printing. Sintering is then carried out preferably from about 200 to about 300° C. In consequence, the resin particles inside the carbon matrix (paste) primarily originating from the dispersion medium and the resin are burnt out and the pores having the size within the range described above are formed, providing thereby a carbon porous material film in which the carbon particles are dispersed. The sintering temperature and the temperature elevation rate can be selected appropriately depending on the kind of the resin particles used, and so forth. FIG. 1 schematically shows the resulting carbon porous material film, wherein reference numeral 1 denotes the substrate, 2 denotes the carbon particles, 3 denotes the pores formed and 4 denotes the carbon matrix formed.

In the case of the meso-porous material, the film is formed in the following way. First, silicon ethoxide as the meso-porous skeletal material, for example, and a surface active agent are mixed with water and resin particles such as acryl particles or polystyrene particles having a diameter within the range of several hundreds of nm to several μm and dispersed in the mixture to prepare a silica type meso-porous material precursor solution. Amorphous silica and alkali silicate can also be used as the silica type meso-porous skeletal material besides the silicon alkoxide. The surface active agent may be a cation, an anion and a nonion agent, and suitable examples are alkyltrimethyl ammonium, a Gemini surface active agent and an ethylene oxide/propylene oxide copolymer. Here, the viscosity adjustment is made by adjusting the amounts of the surface active agent and water. Next, this silica type meso-porous material precursor solution is precisely applied (printed), at a desired position, by ink jet printing or the like. Sintering is then carried out at about 300 to about 400° C. In consequence, a silica type meso-porous material having pores of several nm to dozens of nm is formed, and the resin such as the acryl particles or polystyrene particles is burnt out, providing thereby a porous material film having pores of hundreds of nm to several μm. FIG. 1 schematically shows the resulting silica type meso-porous material film (wherein reference numeral 1 denotes the substrate, 3 denotes the pores formed and 5 denotes the meso-porous material matrix formed).

In the invention, it is possible to form porous materials of meso-porous materials of various metal oxides, carbon, platinum, and organic/inorganic hybrid type by changing the meso-porous skeletal material such as silicon alkoxide described above. The production method itself may be a customary method and examples of the metal oxides are zirconium oxide, tantalum oxide and niobium oxide.

The film using the porous film formed in the manner described above can increase an effective infrared-ray absorption ratio and can be effectively used as the infrared-ray absorption film in an infrared-ray sensor, for example.

The invention can provide an infrared-ray absorption film having a low reflection factor and a high absorption ratio equivalent to those of gold black without using a vacuum process. This infrared-ray absorption film is useful for improving the detection sensitivity of the infrared-ray sensor.

What is claimed is:

1. A method for producing an infrared-ray absorption film using a porous material, the method comprising:

applying a porous material precursor solution onto a substrate, the porous material precursor solution being a solution prepared by dispersing carbon particles and resin particles in a dispersion medium; and conducting sintering.

2. An infrared-ray absorption film as defined in claim 1, wherein the pore size of said porous material is decided by burn-out of said resin particles.

3. A method for producing an infrared-ray absorption film using a porous material, the method comprising:

applying a porous material precursor solution onto a substrate, the porous material precursor material being a solution prepared by dispersing resin particles in a dispersion medium containing a meso-porous skeletal material, a surface active agent and water; and conducting sintering.

4. A method as defined in claim 3, wherein said meso-porous skeletal material is metal alkoxide.

* * * * *